United States Patent
Chiang et al.

(10) Patent No.: US 6,621,095 B2
(45) Date of Patent: Sep. 16, 2003

(54) METHOD TO ENHANCE PERFORMANCE OF THERMAL RESISTOR DEVICE

(75) Inventors: Chien Chiang, Fremont, CA (US); Guy C. Wicker, Santa Clara, CA (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 09/944,349

(22) Filed: Aug. 29, 2001

(65) Prior Publication Data

US 2002/0039310 A1 Apr. 4, 2002

Related U.S. Application Data

(63) Continuation of application No. 09/676,317, filed on Sep. 29, 2000.

(51) Int. Cl.[7] .............................................. H01L 29/06
(52) U.S. Cl. ..................... 257/5; 257/2; 257/3; 257/4; 257/41; 257/50; 257/300; 257/529; 257/530
(58) Field of Search ................................ 257/2, 3, 4, 5, 257/300, 41, 50, 529, 530; 365/182, 185, 108, 127

(56) References Cited

U.S. PATENT DOCUMENTS

| | | | | |
|---|---|---|---|---|
| 5,166,758 A | * | 11/1992 | Ovshinsky et al. | ............. 257/3 |
| 5,296,716 A | | 3/1994 | Ovshinsky et al. | |
| 5,515,316 A | * | 5/1996 | Yamamoto et al. | ......... 365/182 |
| 5,625,524 A | * | 4/1997 | Konagaya et al. | ........... 365/127 |
| 5,789,758 A | * | 8/1998 | Reinberg | ....................... 257/3 |
| 5,879,955 A | * | 3/1999 | Gonzalez et al. | ........... 438/128 |
| 5,920,788 A | | 7/1999 | Reinberg | |
| 5,933,365 A | * | 8/1999 | Klersy et al. | ................ 365/148 |
| 5,970,336 A | | 10/1999 | Wolstenholme et al. | |
| 5,998,244 A | | 12/1999 | Wolstenholme et al. | |
| 6,002,140 A | | 12/1999 | Gonzalez et al. | |
| 6,031,287 A | | 2/2000 | Harshfield | |
| 6,087,674 A | | 7/2000 | Ovshinsky et al. | |
| 6,153,890 A | | 11/2000 | Wolstenholme et al. | |
| 6,189,582 B1 | * | 2/2001 | Reinberg et al. | ............ 438/239 |
| 6,229,157 B1 | | 5/2001 | Sandhu | |
| 6,284,643 B1 | * | 9/2001 | Reinberg | .................... 438/622 |
| 6,437,383 B1 | * | 8/2002 | Xu | .............................. 257/300 |

* cited by examiner

Primary Examiner—Michael S. Lebentritt
Assistant Examiner—Douglas Menz
(74) Attorney, Agent, or Firm—Trop, Pruner & Hu, P.C.

(57) ABSTRACT

An apparatus including a contact on a substrate, a dielectric material overlying the contact, a phase change element overlying the dielectric material on a substrate, and a heater element disposed in the dielectric material and coupled to the contact and the phase change element, wherein a portion of the dielectric material comprises a thermal conductivity less than silicon dioxide. A method including introducing over a contact formed on a substrate, a dielectric material, a portion of which comprises a thermal conductivity less than silicon dioxide, introducing a heater element through the dielectric material to the contact, and introducing a phase change material over the dielectric material and the heater element.

13 Claims, 17 Drawing Sheets

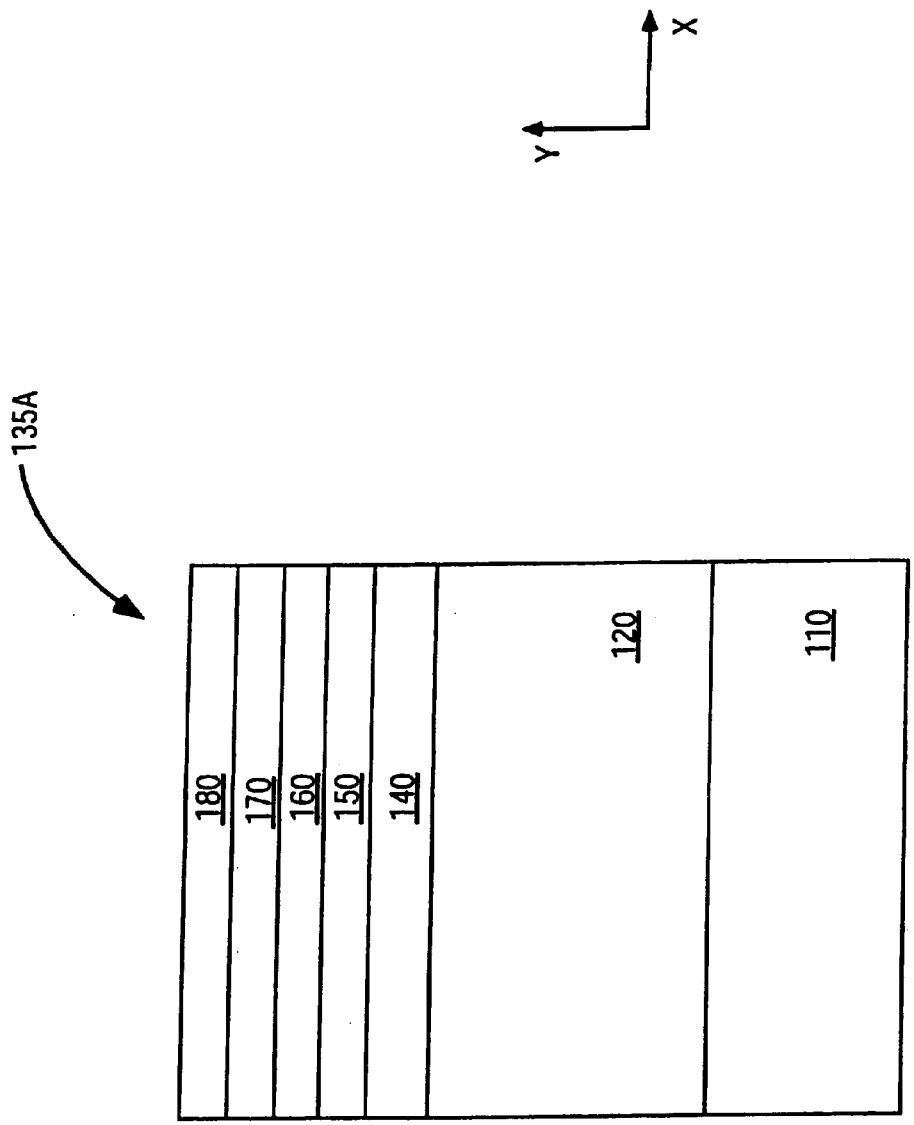

METHOD TO ENHANCE PERFORMANCE OF THERMAL RESISTOR DEVICE

This is a continuation of application Ser. No. 09/676,317, filed Sep. 29, 2000.

BACKGROUND OF THE INVENTION

1. Field of the Invention

The invention relates generally to programmable memory devices.

2. Background

Typical memory applications include dynamic random access memory (DRAM), static random access memory (SRAM), erasable programmable read only memory (EPROM), and electrically erasable programmable read only memory (EEPROM).

Solid state memory devices typically employ microelectronic circuit elements for each memory bit (e.g., one to four transistors per bit) in memory applications. Since one or more electronic circuit elements are required for each memory bit, these devices may consume considerable chip "real estate" to store a bit of information, which limits the density of a memory chip. The primary "non-volatile" memory element of these devices, such as an EEPROM, typically employ a floating gate field effect transistor device that has limited reprogrammability and which holds a charge on the gate of field effect transistor to store each memory bit. These classes of memory devices are also relatively slow to program.

Phase change memory devices use phase change materials, i.e., materials that can be electrically switched between a generally amorphous and a generally crystalline state, for electronic memory application. One type of memory element originally developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These electrical memory devices typically do not use field effect transistor devices, but comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained until reset as that value represents a physical state of the material (e.g., crystalline or amorphous). Thus, phase change memory materials represent a significant improvement in non-volatile memory.

One characteristic common to solid state and phase change memory devices is significant power consumption particularly in setting or resetting memory elements. Power consumption is significant, particularly in portable devices that rely on power cells (e.g., batteries). It would be desirable to decrease the power consumption of a memory device.

BRIEF DESCRIPTION OF THE DRAWINGS

FIG. 6 shows the cross-section of the structure of FIG. 4 through line B–B'.

DETAILED DESCRIPTION OF THE INVENTION

The invention generally relates to an apparatus used, in one aspect, as a memory structure. In one embodiment, the apparatus includes a contact on a substrate, a dielectric material overlying the contact, and a phase change element, such as a chalcogenide memory element, overlying the dielectric material. A heater element is disposed in the dielectric material and coupled to the contact and the phase change element. According to one aspect of the embodiment, a portion of the dielectric material comprises a thermal conductivity less than silicon dioxide. By using a dielectric material having a low thermal conductivity, the energy applied to modify the phase of a portion of the phase change element may be concentrated adjacent the phase change element rather than being dispersed through the dielectric material. In terms of memory device applications, the energy applied to program (e.g., set or reset) a volume of memory material may be concentrated at the volume of memory material. In this manner, an improved memory device (e.g., memory element, memory array, etc.) with improved programming capabilities is presented.

The invention also relates to a method, including a method of forming a memory element. In one embodiment, the method includes introducing, over a contact formed on a substrate, a dielectric material, a portion of which comprises a thermal conductivity less than silicon dioxide. A heater element is introduced through the dielectric material to the contact and a phase change material is introduced over the dielectric material and the heater element. By introducing a dielectric material having a low thermal conductivity over the contact, the energy required to modify the phase of a portion of the phase change material may be concentrated adjacent the phase change material. In terms of memory device applications, the energy required to program a memory device may be concentrated at the memory material. Thus, a method of forming an improved memory device is presented, including a memory device with improved programming characteristics.

In the following paragraphs and in association with the accompanying figures, an example of a memory device formed according to an embodiment of the invention is presented. The embodiment describes a memory material including a phase change material wherein the phase of the material determines the state of the memory element.

Figure 1:
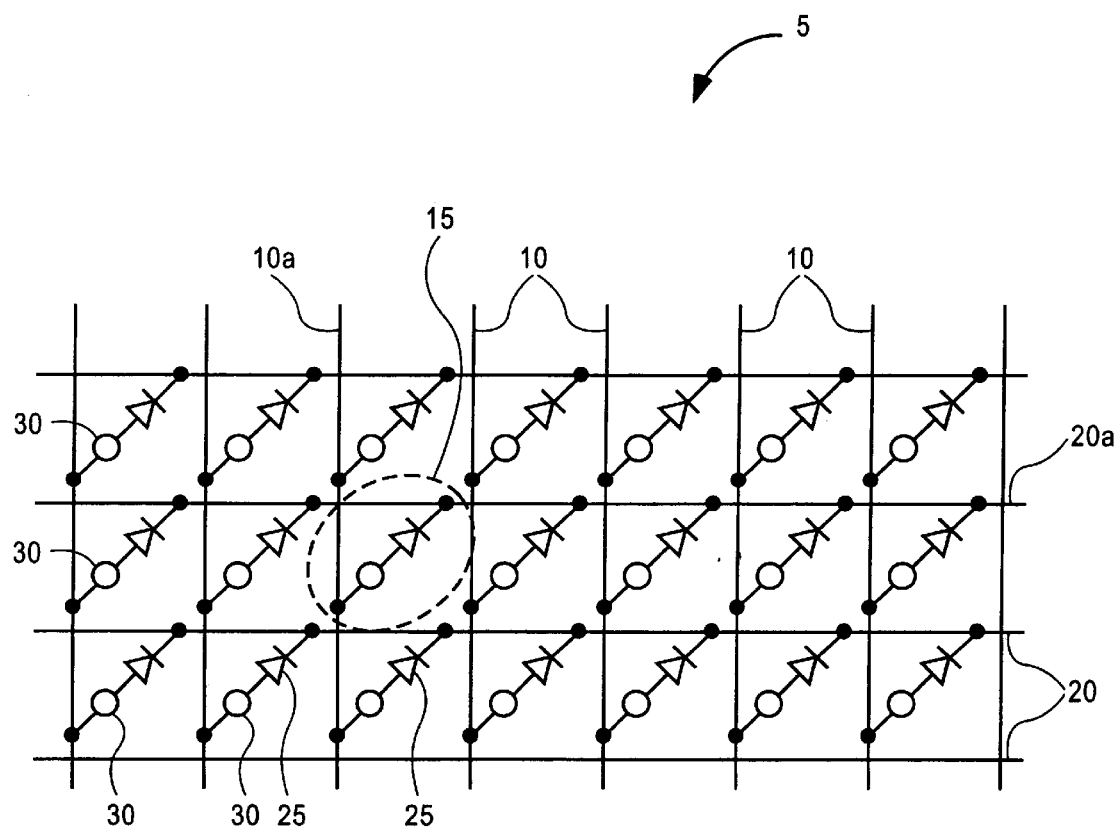
FIG. 1 is a schematic diagram of an array of memory elements according to an embodiment of the invention.

FIG. 1 shows a schematic diagram of an embodiment of a memory array comprised of a plurality of memory elements presented and formed in the context of the invention. In this example, the circuit of memory array 5 includes an xy grid with memory element 30 electrically interconnected in series with isolation device 25 on a portion of a chip. Address lines 10 (e.g., columns) and 20 (e.g., rows) are connected, in one embodiment, to external addressing circuitry in a manner known to those skilled in the art. One purpose of the xy grid array of memory elements in combination with isolation devices is to enable each discrete memory element to be read and written without interfering with the information stored in adjacent or remote memory elements of the array.

A memory array such as memory array 5 may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer reduced through singulation into discrete die or chips, some or all of the die or chips having a memory array formed thereon. Additional addressing circuitry (e.g., decoders, etc.) may be formed in a similar fashion as known to those of skill in the art.

Figure 2:
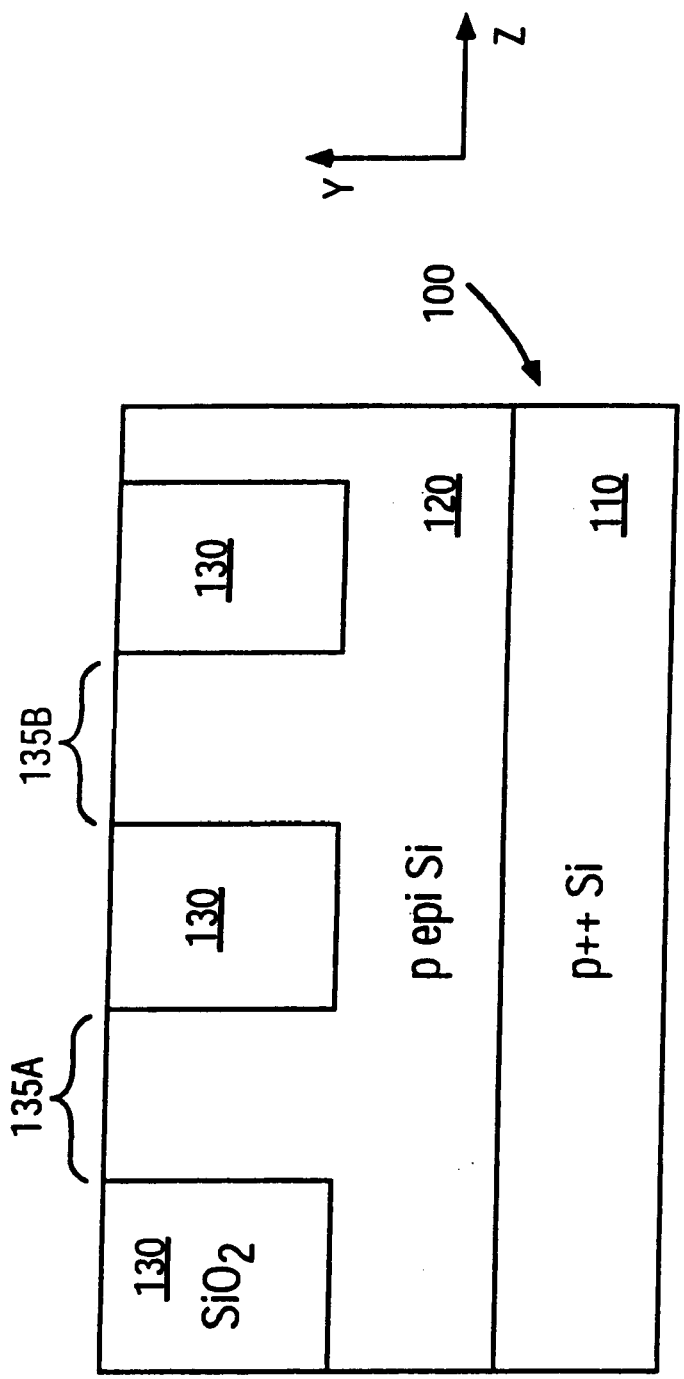
FIG. 2 schematically illustrates a cross-sectional planar side view of a portion of a semiconductor substrate having dielectric trenches formed therein defining a z-direction thickness of a memory cell in accordance with one embodiment of the invention of forming a memory element on a substrate.

FIGS. 2–14 illustrate an embodiment of the fabrication of representative memory element 15 of FIG. 1. FIG. 2 shows a portion of substrate 100 that is, for example, a semiconductor substrate. In this example, a P-type dopant such as boron is introduced in portion 110. In one example, a suitable concentration of P-type dopant is on the order of above $5 \times 10^{19} - 1 \times 10^{20}$ atoms per cubic centimeters (atoms/$cm^3$) rendering portion 110 of substrate 100 representatively $P^{++}$. Overlying portion 110 of substrate 100, in this example, is portion 120 of P-type epitaxial silicon. In one example, the dopant concentration is on the order of about $10^{16} - 10^{17}$ atoms/$cm^3$. The introduction and formation of P-type epitaxial silicon portion 120 and $P^{++}$ silicon portion 110 may follow techniques known to those of skill in the art.

FIG. 2 also shows shallow trench isolation (STI) structures 130 formed in epitaxial portion 120 of substrate 100. As will become apparent in the subsequent discussion, STI structures 130 serve, in one aspect, to define the z-direction thickness of a memory element cell, with at this point only the z-direction thickness of a memory element cell defined. In another aspect, STI structures 130 serve to isolate individual memory elements from one another as well as associated circuit elements (e.g., transistor devices) formed in and on the substrate. STI structures 130 are formed according to techniques known to those skilled in the art.

Figure 3:
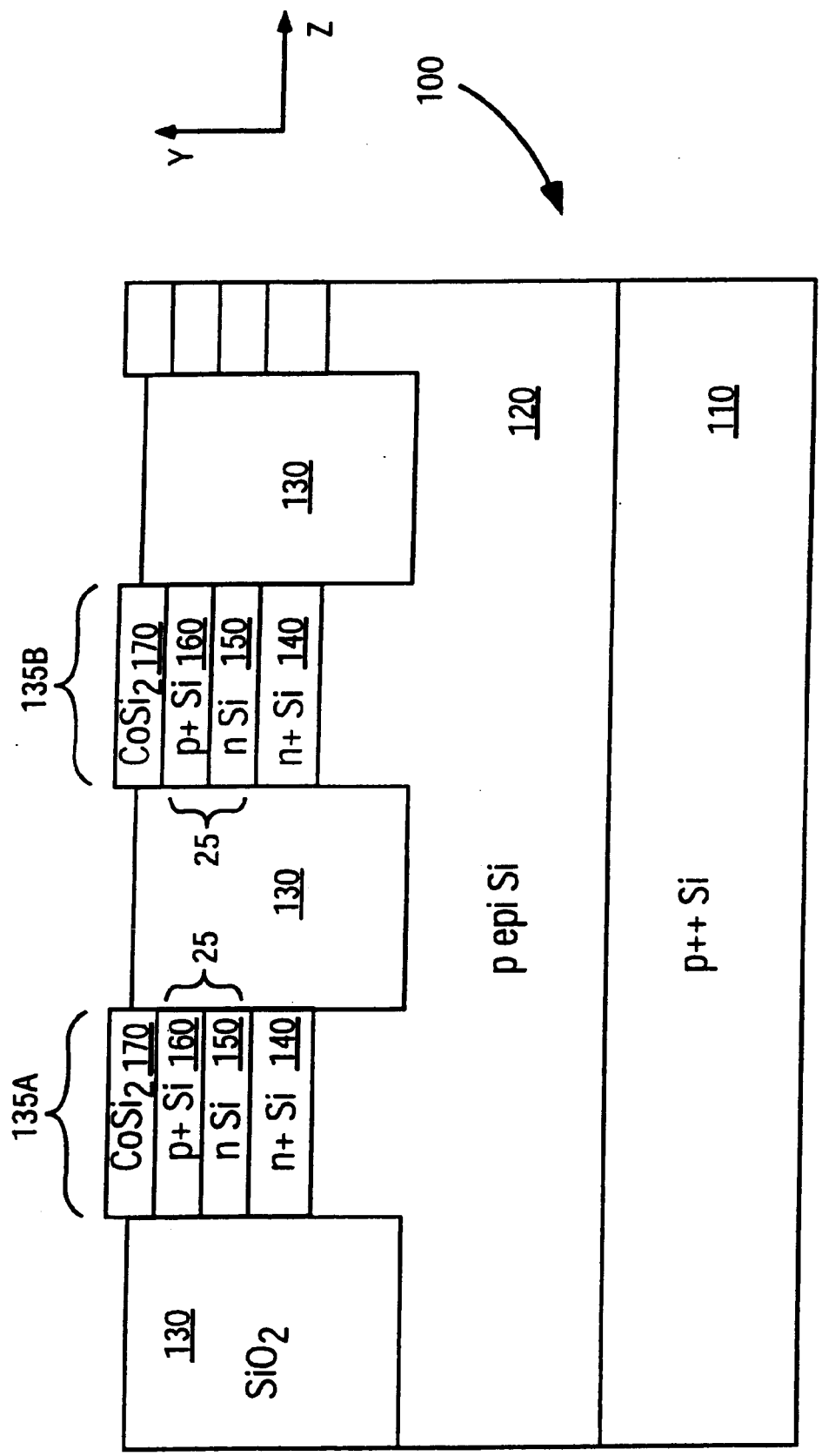
FIG. 3 shows the structure of FIG. 2, through the same cross-sectional view, after the introduction of dopants to form an isolation device for a memory element in accordance with one embodiment of the invention.

FIG. 3 shows the structure of FIG. 2 after a further fabrication operation in memory cell regions 135A and 135B. In one embodiment, memory cell regions 135A and 135B are introduced as strips with the x-direction dimension greater than the z-direction dimension. Overlying epitaxial portion 120 of substrate 100 is first conductor or signal line material 140. In one example, first conductor or signal line material 140 is N-type doped polysilicon formed by the introduction of, for example, phosphorous or arsenic to a concentration on the order of about $10^{18} - 10^{19}$ atoms/$cm^3$ (e.g., $N^+$ silicon). In this example, first conductor or signal line material 140 serves as an address line, a row line (e.g., row line 20 of FIG. 1). Overlying first conductor or signal line material 140 is an isolation device (e.g., isolation device 25 of FIG. 1). In one example, the isolation device is a PN diode formed of N-type silicon portion 150 (dopant concentration on the order of about $10^{17} - 10^{18}$ atoms/$cm^3$) and P-type silicon portion 160 (dopant concentration on the order of about $10^{19} - 10^{20}$ atoms/$cm^3$). Although a PN diode is shown, it is to be appreciated that other isolation structures are similarly suitable. Such devices include, but are not limited to, MOS devices.

Referring to FIG. 3, overlying the isolation device in memory cell regions 135A and 135B is reducer material 170 of, in this example, a refractory metal silicide such as cobalt silicide ($CoSi_2$). Reducer material 170, in one aspect, serves as a low resistance material in the fabrication of peripheral circuitry (e.g., addressing circuitry) of the circuit structure on the chip. Thus, reducer material 170 is not required in terms of forming a memory element as described. Nevertheless, because of its low resistance property, its inclusion as part of the memory cell structure between isolation device 25 and memory element 30 is utilized in this embodiment.

Figure 4:
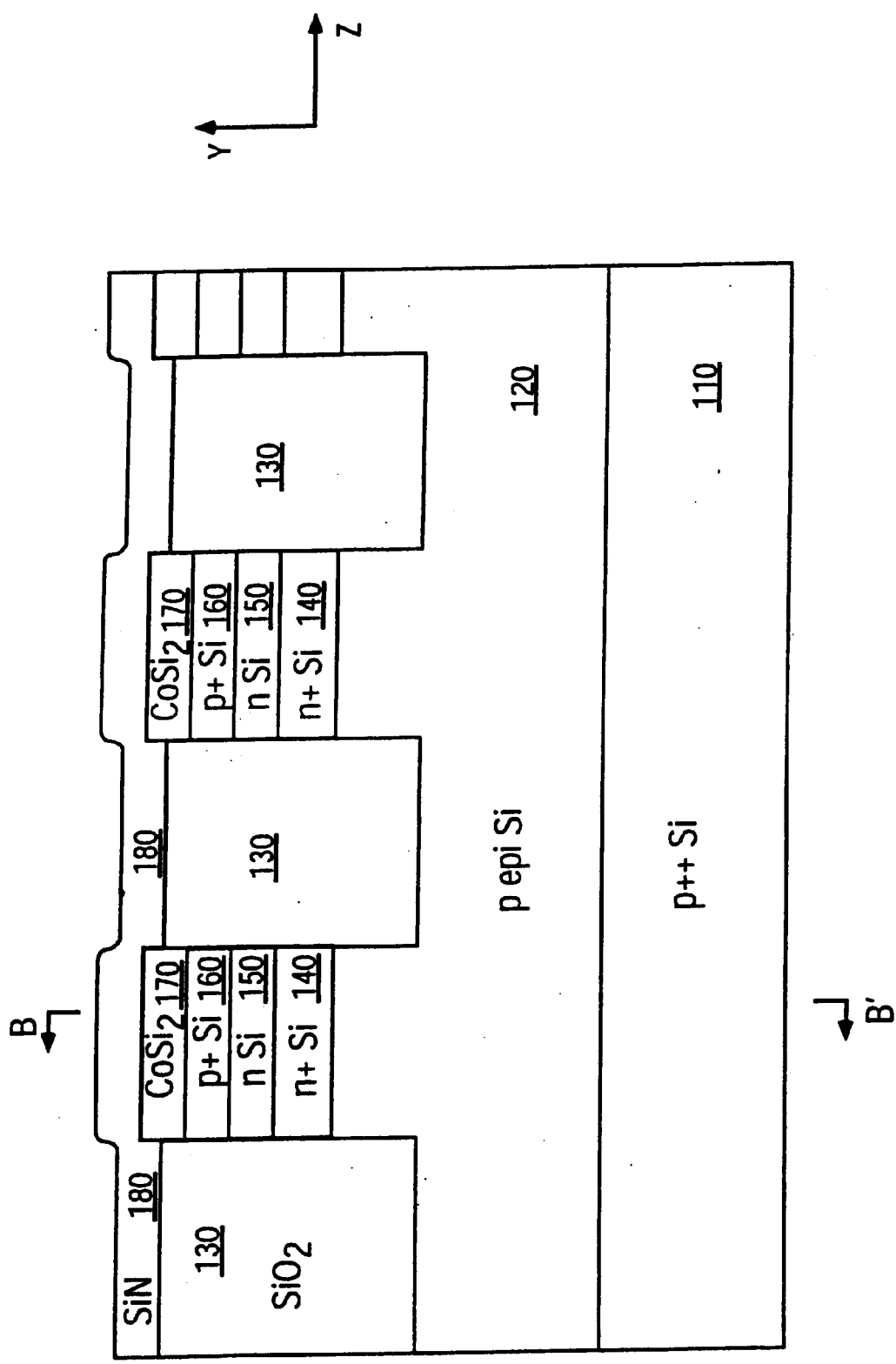
FIG. 4 shows the structure of FIG. 3 after the introduction of a masking material over the structure in accordance with one embodiment of the invention.
Figure 5:
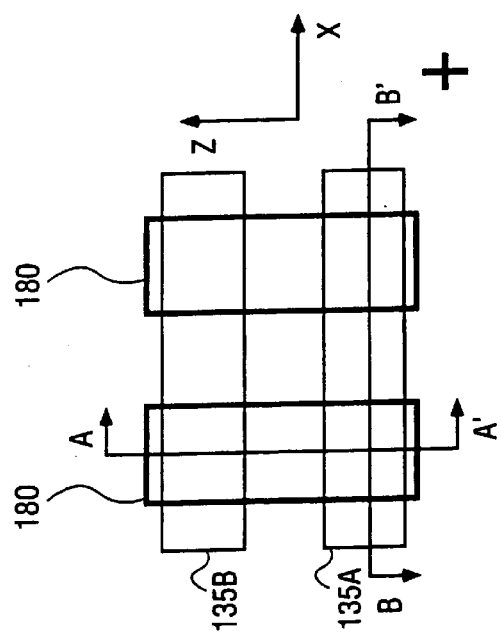
FIG. 5 shows a schematic top view of the structure of FIG. 4.

FIG. 4 shows the structure of FIG. 3 after the introduction of masking material 180. As will become clear later, masking material 180 serves, in one sense, as an etch stop for a subsequent etch operation. FIG. 5 schematically shows memory cell regions 135A and 135B in an xz plane. Overlying the memory cell is masking material 180. FIG. 6 shows a cross-sectional side view of memory cell region 135A through line B–B' of FIG. 5 (i.e., an xy perspective). In one embodiment, a suitable material for masking material 180 is a dielectric material such as silicon nitride ($Si_3N_4$).

Figure 7:
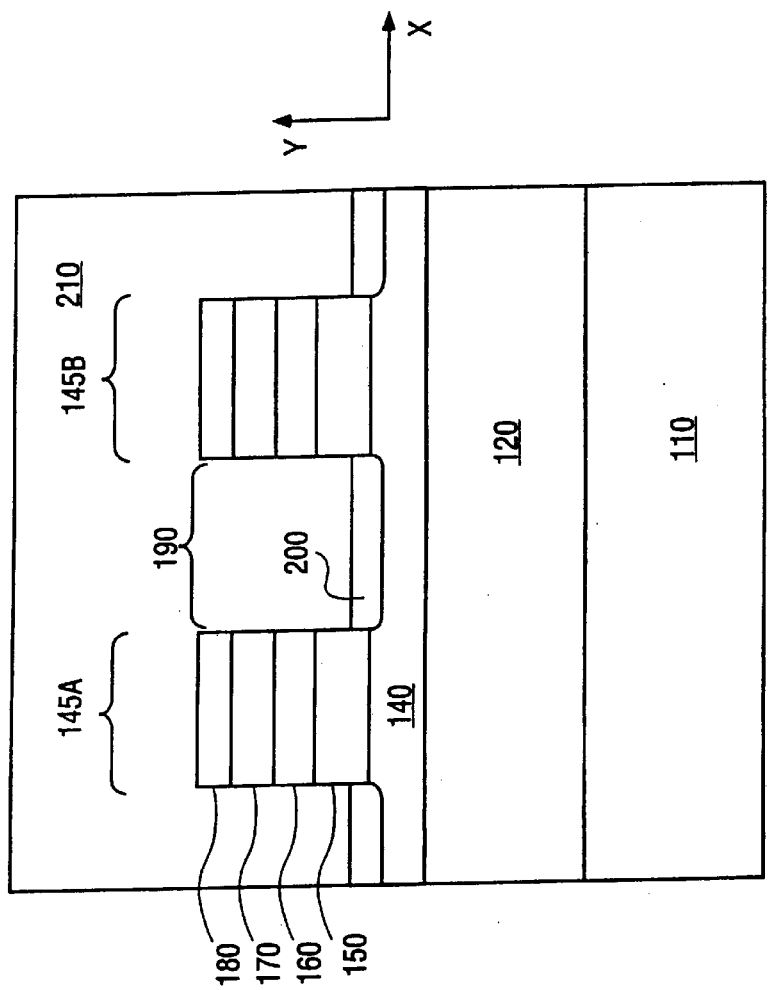
FIG. 7 shows the structure of FIG. 5, through the same cross-sectional view, after the patterning of the x-direction thickness of a memory cell, the introduction of a dopant between the cells, and the introduction of a dielectric material over the structure.

FIG. 7 shows the structure of FIG. 6 (from an xy perspective) after patterning of the x-direction thickness of the memory cell material. FIG. 7 shows two memory cells 145A and 145B patterned from memory cell region 135A (see FIG. 5). The patterning may be accomplished using conventional techniques for etching, in this example, refractory metal silicide and silicon material to the exclusion of masking material 180 (e.g., $Si_3N_4$). The definition of the x-direction thickness involves, in one embodiment, an etch to conductive material 150 of the memory line stack to define memory cells 145A and 145B of memory cell region 135A. In the case of an etch, the etch proceeds through the memory line stack to, in this example, a portion of conductor or signal line material 150. A timed etch may be utilized to stop an etch at this point. Following the patterning, N-type dopant is introduced at the base of each trench 190 to form pockets 200 having a dopant concentration on the order of about $10^{18-1020}$ atoms/$cm^3$ (e.g., $N^+$ region) between memory cells 145A and 145B. Pockets 200 serve, in one sense, to maintain continuity of a row line.

FIG. 7 also shows dielectric material 210 introduced over the structure to a thickness on the order of 100 Å to 50,000 Å. In one embodiment, dielectric material 210 is silicon dioxide ($SiO_2$). In another embodiment, dielectric material 210 is a material selected for its reduced thermal conductivity, κ, preferably a thermal conductivity less than $\kappa_{SiO_2}$, more preferably three to 10 times less $\kappa_{SiO_2}$. As a general convention, $SiO_2$ and silicon nitride ($Si_3N_4$) have κ values on the order of 1.0. Thus, suitable materials for dielectric material 210 include those materials that have κ values less than 1.0. Certain high temperature polymers having κ values less than 1.0, carbide materials, Aerogel, Xerogel (κ on the order of 0.1) and their derivatives.

As will become clear hereinafter, all of dielectric material 210 need not be of a material having a thermal conductivity, κ, less than $\kappa_{SiO_2}$. Instead, a first potion of dielectric material introduced, for example, in a portion including the entire portion of trench 190 and a portion over dielectric material 180 may be a first dielectric of $SiO_2$ or a material having a thermal conductivity, κ, similar to $\kappa_{SiO_2}$. A second portion over the first portion may then be of a material having a κ, less than $\kappa_{SiO_2}$. In other words, a portion of dielectric material 210 more proximally adjacent to subsequently introduced memory material has a κ less than $\kappa_{SiO_2}$.

FIGS. 8–13 generally describe, among other things, the introduction and of memory material and an electrode between a contact (e.g., first conductor or signal line material 140) and the memory material. In the embodiment described hereinafter, the electrode material is "edgewise adjacent" to the memory material. That is, only an edge or a portion of an edge of the electrode material is adjacent to the memory material. Substantially all of the remainder of the electrode is remote to the memory material. Preferably, substantially all of the electrical communication between the electrode is through an edge of the electrode or a portion of an edge. That is, it is preferable that substantially all electrical communication is through at least a portion of an edge (i.e., an "edge portion") of the electrode.

As used herein the terminology "area of contact" is the portion of the surface of an electrical contact through which the electrical contact electrically communicates with the memory material. As noted, in one embodiment, substantially all electrical communication between the memory material and the electrode occurs through all or a portion of an edge of the electrode. Hence, the area of contact between the electrode and the memory material is an edge of the electrode or a portion of an edge of the electrode. That is, the area of contact between the electrode and the memory material is an "edge portion" of the electrode. It is again noted that the electrode need not actually physically contact the memory material. It is sufficient that the electrode is in electrical communication with the memory material. The area of contact, being only an edge portion (i.e., an edge or a portion of an edge) of the electrode, is thus very small and is proportional to the thickness of the electrode. In one aspect, an objective is to reduce the area of contact the electrode to the memory material.

Figure 8:
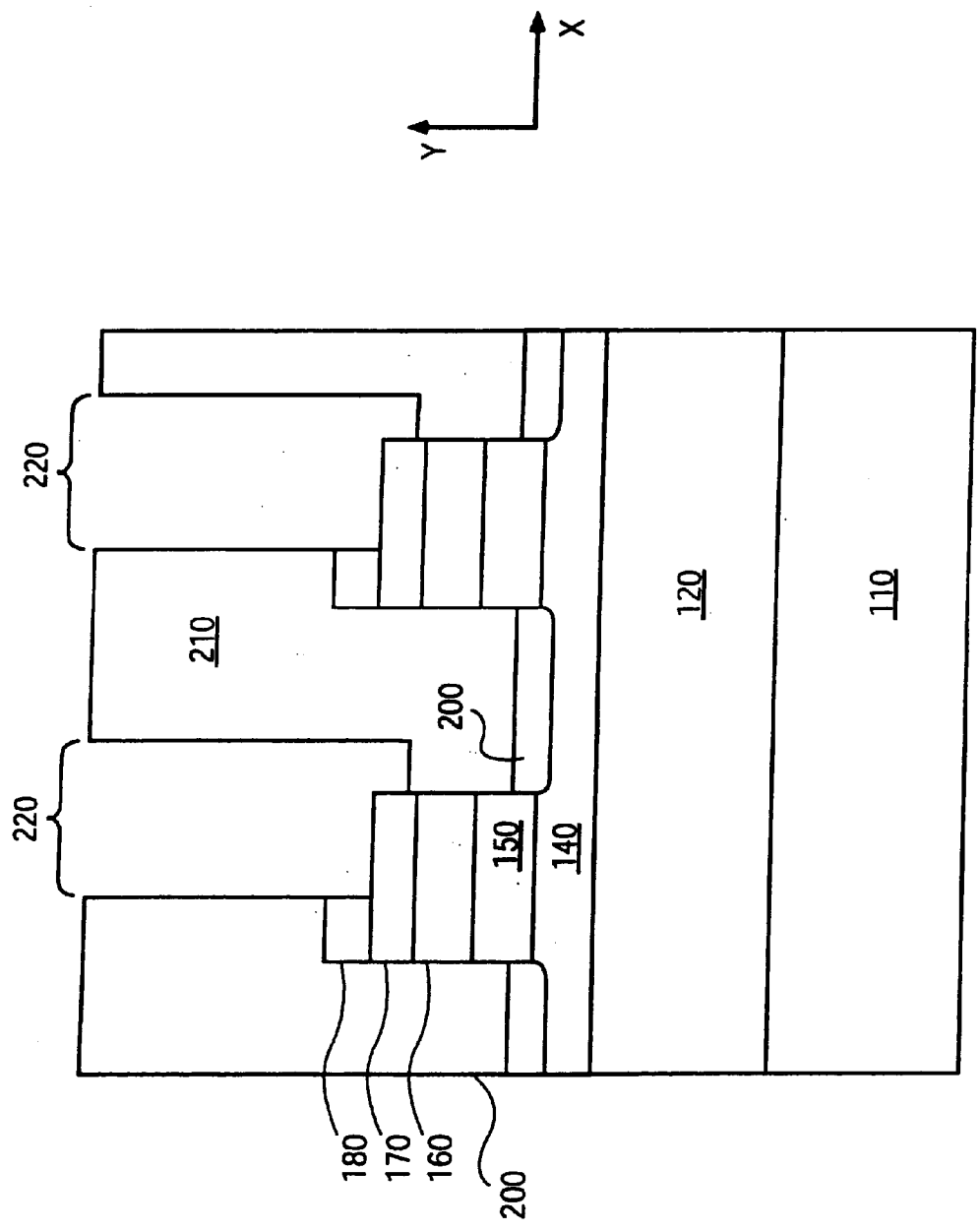
FIG. 8 shows the structure of FIG. 7, through the same cross-sectional view, after the formation of trenches through the dielectric material in accordance with one embodiment of the invention.

FIG. 8 shows the structure of FIG. 7 after the formation of trenches 220 through dielectric materials 210 and 180 to reducer material 170. The formation of trenches 220 may be accomplished using etch patterning with an etchant(s) selective for etching dielectric material 210 and masking material 180 and not reducer material 170 (e.g., reducer 170 serving as an etch stop).

Figure 9:
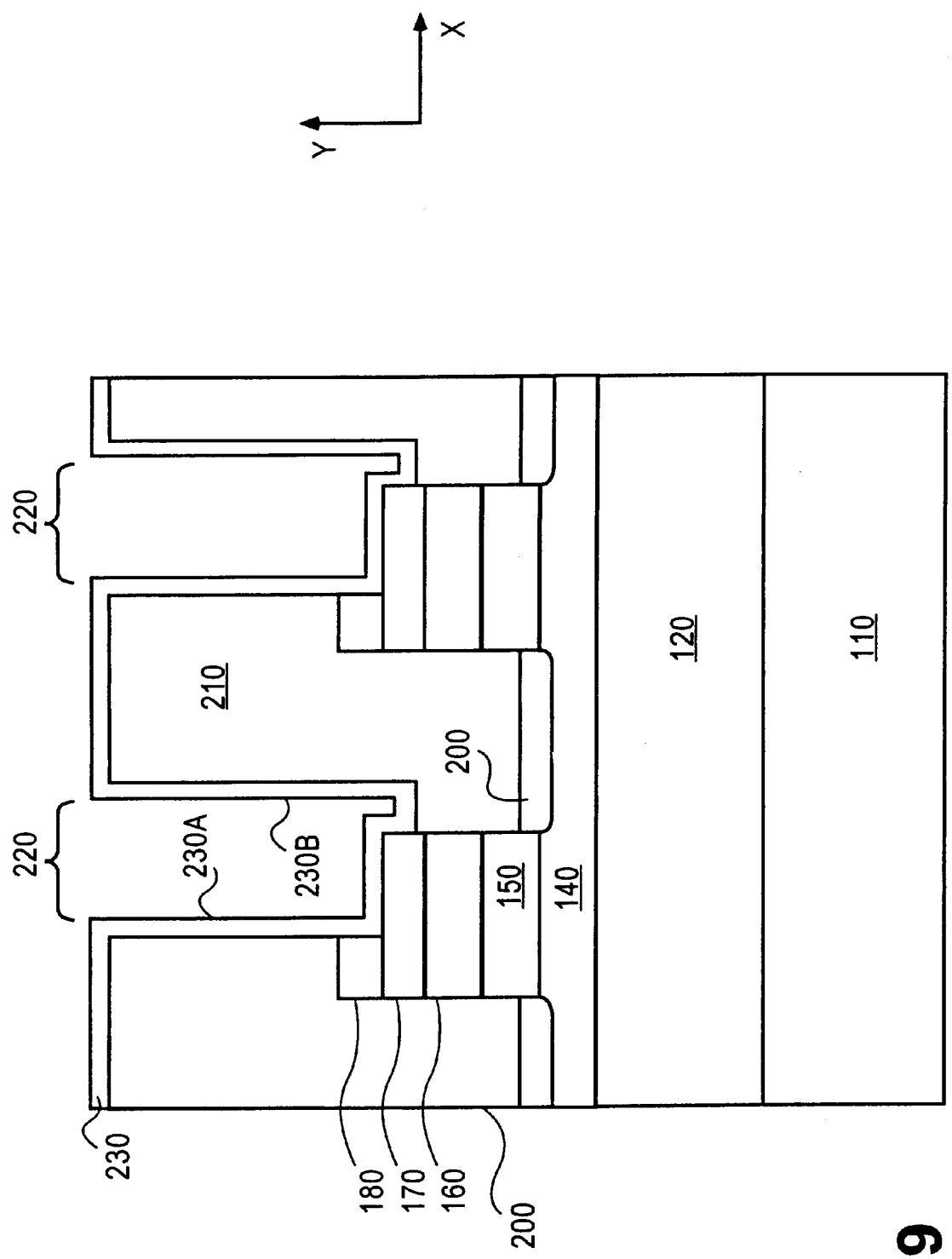
FIG. 9 shows the structure of FIG. 8, through the same cross-sectional view, after the introduction of an electrode material over the structure in accordance with one embodiment of the invention.

FIG. 9 shows the structure of FIG. 8 after the conformal introduction of electrode material 230. In one example, electrode material 230 is polycrystalline semiconductor material such as polycrystalline silicon. Other suitable materials include carbon and semi-metals such as transition metals including, but not limited to, titanium, titanium-tungsten (TiW), titanium nitride (TiN) and titanium aluminum nitride (TiAlN). The introduction is conformal in the sense that electrode material 230 is introduced along the side walls and base of trench 220 such that electrode material 230 is in contact with reducer material 170. The conformal introduction of electrode material 230 that is, for example, polycrystalline silicon may follow conventional introduction techniques known to those skilled in the art including chemical vapor deposition (CVD) techniques.

In the example described, it is preferable that only a portion of the electrode material extending in the figures in a y-direction, i.e., only one of two "leg portions" extending in a y-direction, constitutes the area of contact with the subsequently introduced memory material. Accordingly, in the case of non-conductive material selected for electrode material 230, such as intrinsic polycrystalline silicon, one of the two leg portions of electrode material 230 is rendered conductive for a conductive path to first conductor or signal line material 140. For polycrystalline silicon for electrode material 230, the conductivity of the material may be increased by doping techniques, by for example angled ion implantation into the desired leg portion. In the case of conductive material selected for electrode material 230, an otherwise conductive path between the non-selected leg portion and first conductor or signal line material 140 may be terminated by, for example introducing a dielectric material between the electrode material and the memory material or by removing a portion of the electrode material by, for example, etching.

Figure 10:
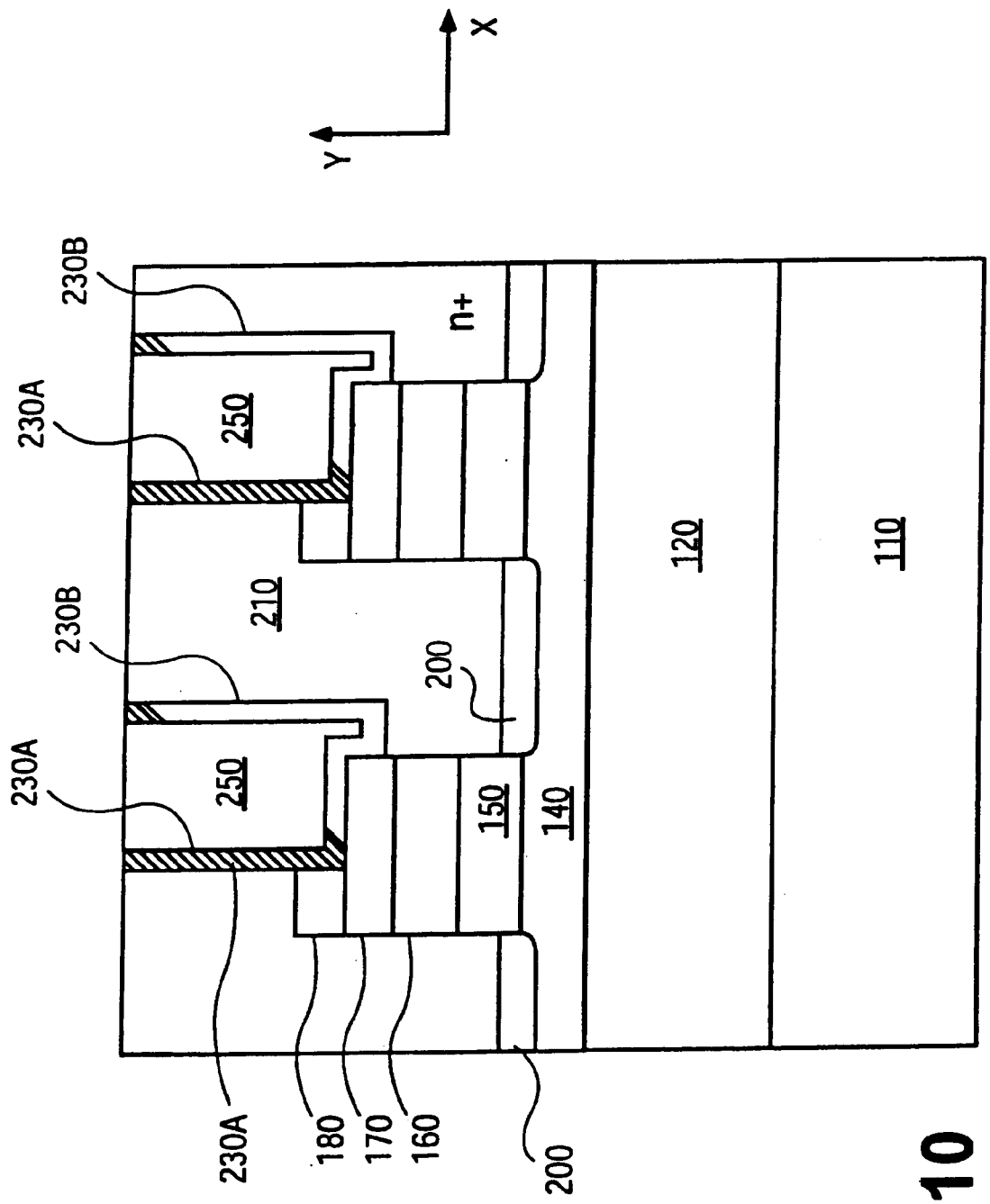
FIG. 10 shows the structure of FIG. 9, through the same cross-sectional view, after the introduction of a dopant into the electrode material in accordance with one embodiment of the invention.

FIG. 10 shows the structure of FIG. 9 where only one of the leg portions of electrode material 230 serves as a conductive path between first conductor or signal line material 140 and a subsequently introduced memory material. In this example, electrode material 230 is a generally non-conductive intrinsic polycrystalline silicon. After the introduction of a dopant into a portion of electrode material 230, two portions are defined, electrode material 230A and electrode material 230B. As illustrated, electrode material 230A is doped about its length from reducer material 170 and will act as a conductive path between first conductor or signal line material 140 and subsequently introduced memory material. Electrode material 230B is generally non-conductive (e.g., predominantly intrinsic polycrystalline silicon) and thus will generally not serve as a conductive path.

FIG. 10 also shows the structure after the introduction of dielectric material 250 into trenches 220. In one embodiment, dielectric material 250 is silicon dioxide ($SiO_2$). In another embodiment, dielectric material 250 is a material that has a thermal conductivity, κ, that is less than the thermal conductivity of $SiO_2$, $\kappa_{SiO_2}$ preferably three to 10 times less than $\kappa_{SiO_2}$. Materials such as described above with reference to FIG. 7 and the accompanying text (including certain polymers and Xerogel) are suitable. Also, from that referenced discussion, it is to be appreciated that the entire portion of dielectric material 250 need not be of a material having a κ less than $\kappa_{SiO_2}$. In one embodiment, only that portion of material adjacent a subsequently introduced memory material has a κ less than $\kappa_{SiO_2}$. Following introduction, the structure is subjected to a planarization that removes the horizontal component of electrode material 230. Suitable planarization techniques include those known to those of skill in the art, such as chemical or chemical-mechanical polish (CMP) techniques.

In the above description to form the structure shown in FIG. 10, a portion of dielectric materials 210 or 250 are desired to be of a material that has a thermal conductivity, κ, less than $\kappa_{SiO_2}$. In one embodiment, that may be all or a portion of dielectric material 210, with dielectric material 250 of $SiO_2$ or a material with a thermal conductivity similar to $\kappa_{SiO_2}$. Alternatively, all or a portion of dielectric material 250 may be of a material with a thermal conductivity, κ, less than $\kappa_{SiO_2}$, with dielectric material 210 of $SiO_2$ or a material with a thermal conductivity similar to $\kappa_{SiO_2}$. In a further embodiment, all or a portion of both dielectric material 210 and dielectric material 250 may be of a material with a thermal conductivity, κ, less than $\kappa_{SiO_2}$.

Figure 11:
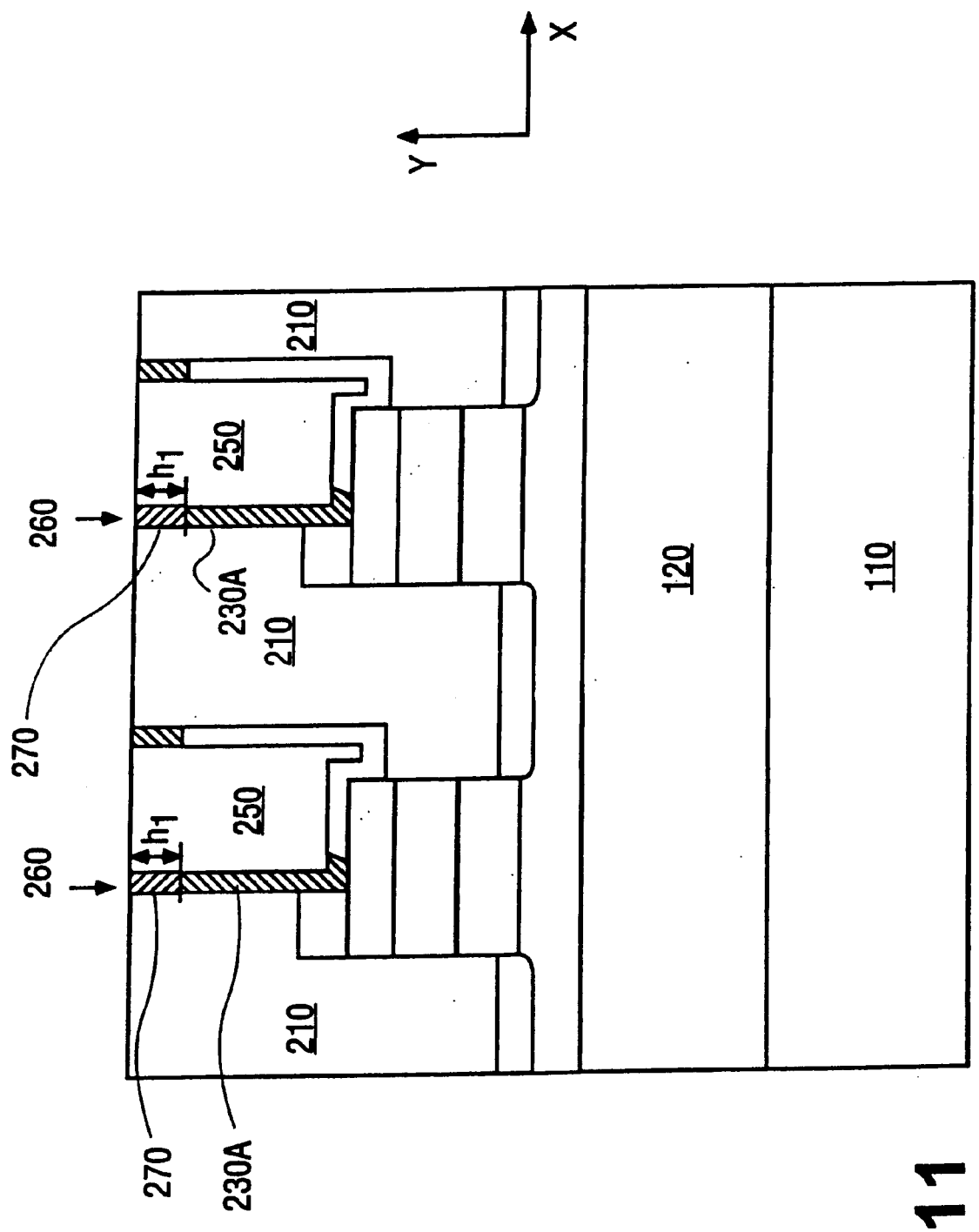
FIG. 11 shows the structure of FIG. 10, through the same cross-sectional view, after the introduction of a modifying species into a portion of the electrode material in accordance with one embodiment of the invention.

FIG. 11 shows the structure of FIG. 10 after the optional introduction of modifying species 260 into a portion of electrode material 230A. In one example, modifying species 260 is introduced to raise the local resistance of electrode material 230A at a portion of electrode material 270 defined by length, $h_1$. Electrode material 270 of polycrystalline silicon and $SiO_2$, $Si_3N_4$, $Si_xO_yN_z$, or SiC generally has a higher resistivity than doped polycrystalline silicon of electrode material 230A. Suitable materials for modifying species also include those materials that are introduced (e.g., added, reacted, or combined) into electrode material 230A and raise the resistivity value within the electrode (e.g., raise the local resistance near a volume of memory material), and the resistivity value is also stable at high temperatures. Such modifying species may be introduced by way of implantation or thermal means with, for example, a gaseous ambient.

Figure 12:
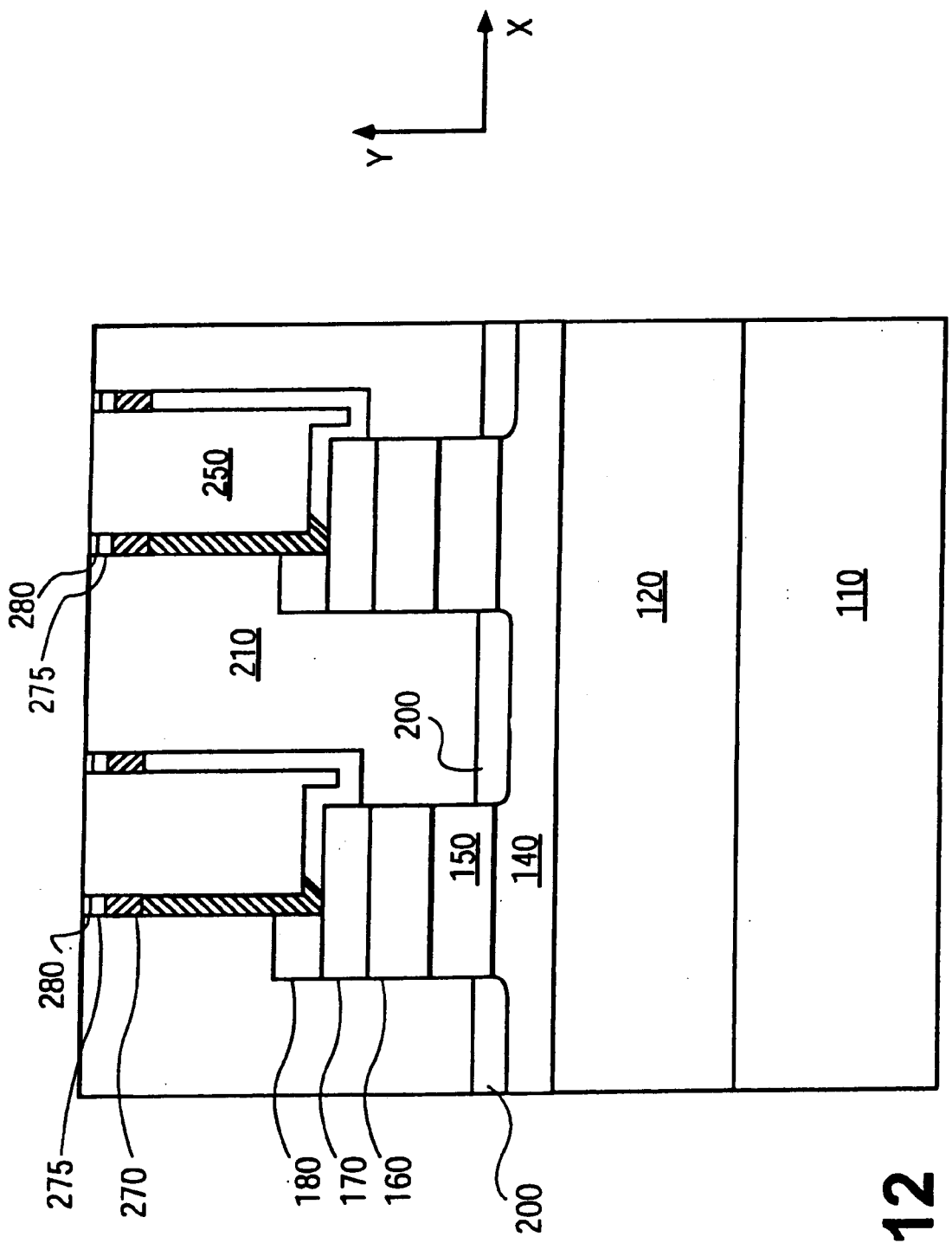
FIG. 12 shows the structure of FIG. 11, through the same cross-sectional view, after the introduction of barrier material over the electrode in accordance with one embodiment of the invention.

FIG. 12 shows the structure of FIG. 11 after the optional introduction of barrier materials 270 and 280. Barrier material 270 is, for example, titanium silicide ($TiSi_2$) introduced to a thickness on the order of about 100–300 Å. Barrier material 280 is, for example, titanium nitride (TiN) similarly introduced to a thickness on the order of about 25–300 Å. The introduction of barrier materials 270 and 280 may be accomplished using techniques known to those skilled in the art.

Figure 13:
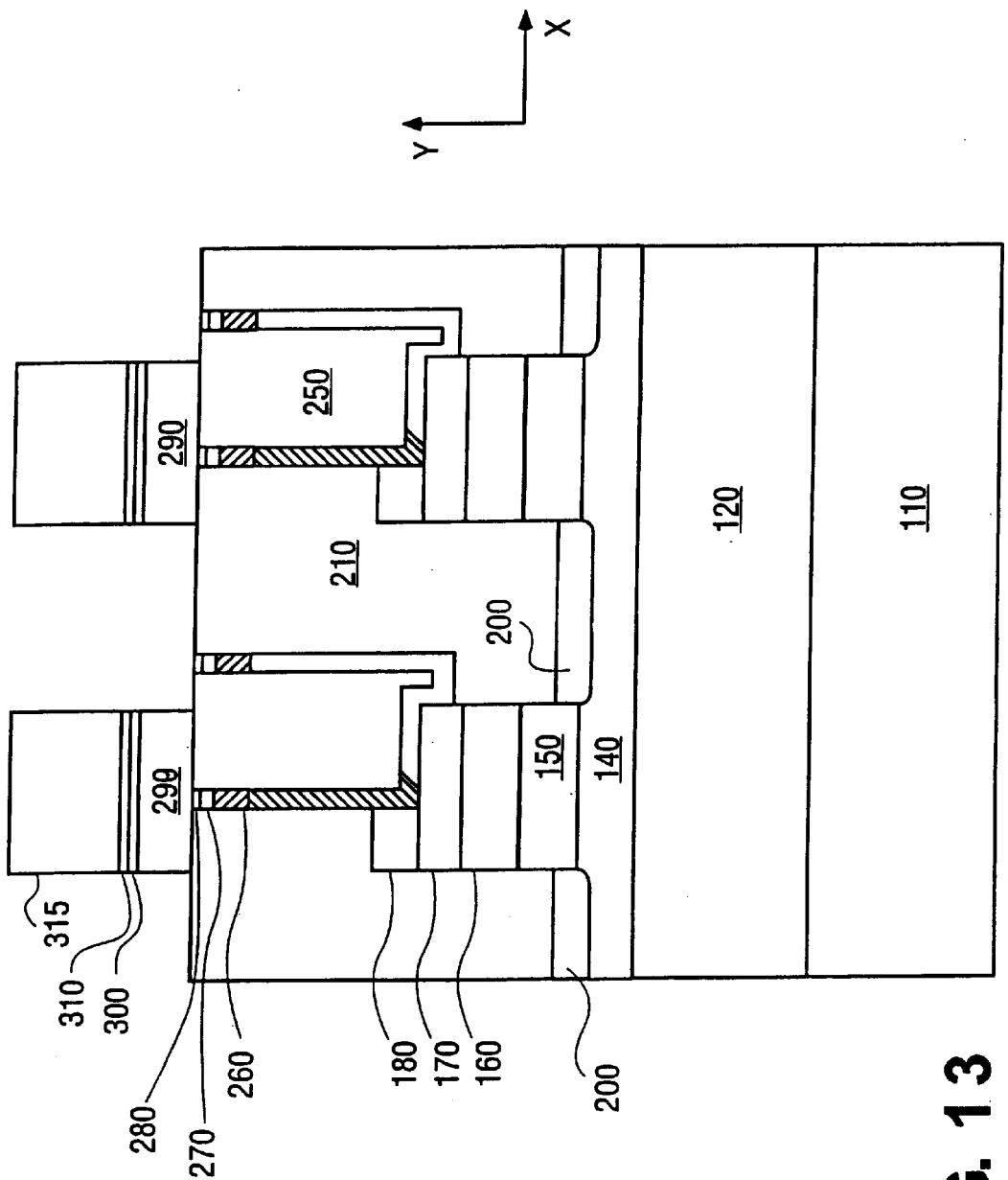
FIG. 13 shows the structure of FIG. 12, through the same cross-sectional view, after the introduction of a volume of memory material and second conductors over the structure, in accordance with one embodiment of the invention.

FIG. 13 shows the structure of FIG. 12 after the introduction of a volume of memory material 290 (represented as memory element 30 in FIG. 1). In one example, memory material 290 is a phase change material. In a more specific example, memory material 290 includes a chalcogenide element(s). Examples of phase change memory material 290 include, but are not limited to, compositions of the class of tellerium-germanium-antimony ($Te_xGe_ySb_z$) material. Memory material 290, in one example according to current technology, is introduced with a thickness on the order of about 600 Å.

Overlying memory material 290 in the structure of FIG. 13 are barrier materials 300 and 310 of, for example, titanium (Ti) and titanium nitride (TiN), respectively. Barrier material serves, in one aspect, to inhibit diffusion between the volume of memory material 290 and second conductor or signal line material overlying the volume of memory material 290 (e.g., second electrode 10). Overlying barrier materials 300 and 310 is second conductor or signal line material 315. In this example, second conductor or signal line material 315 serves as an address line, a column line (e.g., column line 10 of FIG. 1). Second conductor or signal line material 315 is patterned to be, in one embodiment, generally orthogonal to first conductor or signal line material 140 (column lines are orthogonal to row lines). Second conductor or signal line material 315 is, for example, an aluminum material, such as an aluminum alloy. Methods for the introduction and patterning of the barrier materials and second conductor or signal line material 315 include such techniques as known to those of skill in the art. It is to be appreciated at this point that memory material 290 may be patterned contiguously with second conductor or signal line material 315 such that memory material 290 is itself strips (like second conductor or signal line material 315) or is in a cellular form (achieved by patterning prior to patterning second conductor or signal line material 315).

Figure 14:
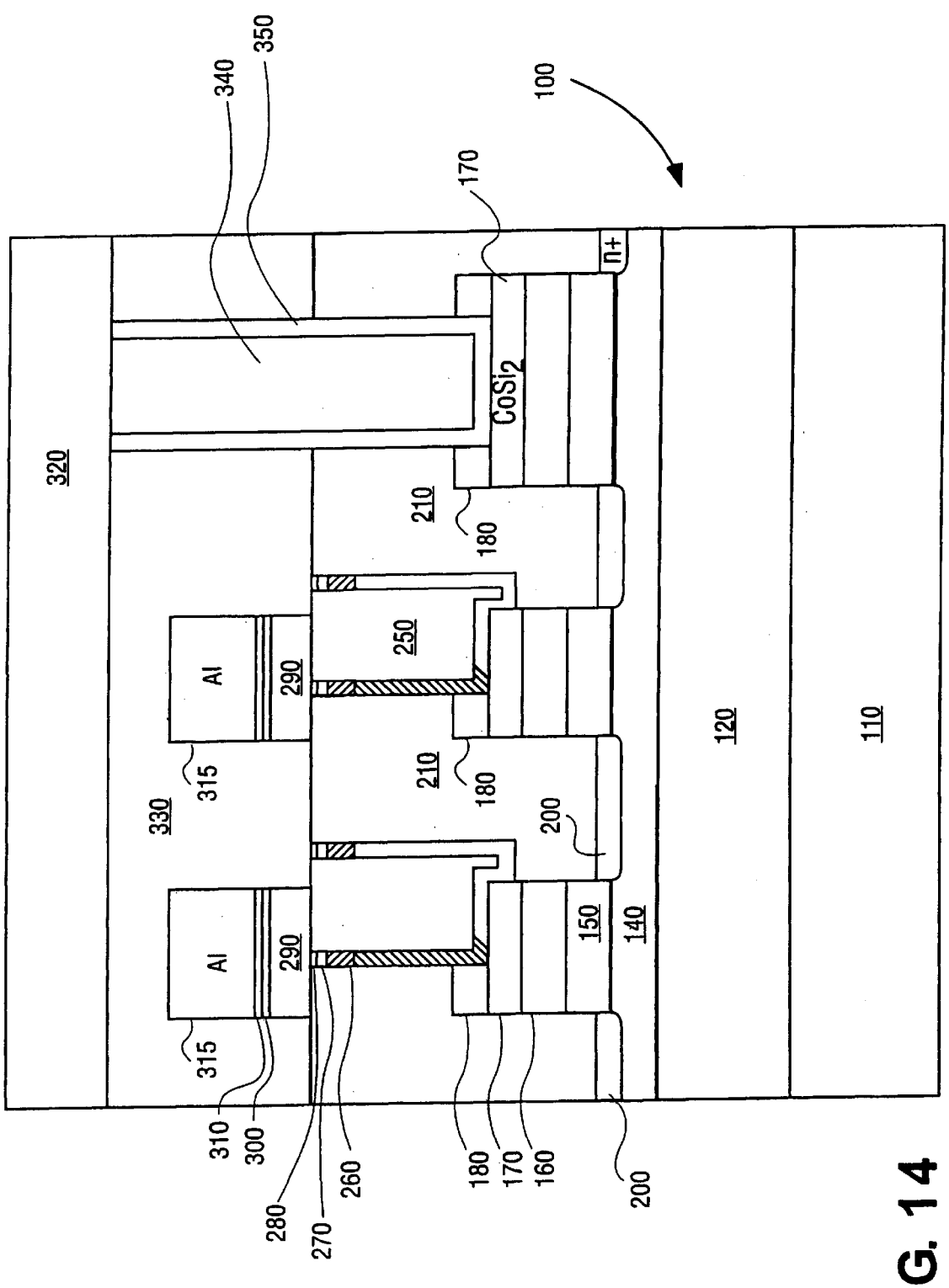
FIG. 14 shows the structure of FIG. 13, through the same cross-sectional view, after the introduction of the dielectric material over the second conductor and a third conductor coupled to the first conductor in accordance with an embodiment of the invention.

FIG. 14 shows the structure of FIG. 13 after the introduction of dielectric material 330 over second conductor or signal line material 315. Dielectric material 330 is, for example, $SiO_2$ or other suitable material that surrounds second conductor or signal line material 315 and memory material 290 to electronically isolate such structure. Following introduction, dielectric material 330 is planarized and a via is formed in a portion of the structure through dielectric material 330, dielectric material 210, and masking material 180 to reducer material 170. The via is filled with conductive material 340 such as tungsten (W) and barrier material 350 such as a combination of titanium (Ti) and titanium nitride (TiN). Techniques for introducing dielectric material 330, forming and filling conductive vias, and planarizing are known to those skilled in the art.

The structure shown in FIG. 14 also shows additional conductor or signal line material 320 introduced and patterned to mirror that of first conductor or signal line material 140 (e.g., row line) formed on substrate 100. Mirror conductor line material 320 mirrors first conductor or signal line material 140 and is coupled to first conductor or signal line material 140 through a conductive via. By mirroring a doped semiconductor such as N-type silicon, mirror conductor line material 320 serves, in one aspect, to reduce the resistance of conductor or signal line material 140 in a memory array, such as memory array 5 illustrated in FIG. 1. A suitable material for mirror conductor line material 320 includes an aluminum material, such as an aluminum alloy.

In memory element 15 of FIG. 1 and an embodiment fabricated in accordance with techniques described in FIGS. 2–14, the electrode delivers electrical current to the memory material. As the electrical current passes through the electrode and through the memory material, at least a portion of the electric potential energy of the electrons is transferred to the surrounding material as heat. That is, the electrical energy is converted to heat energy via Joule heating. The amount of electrical energy converted to heat energy (that is, the amount of Joule heating) increases with the resistivity of the material as well as with the current density passing through the material. By locating a more resistive material adjacent to the memory material and a less resistive material remote to the memory material, there is a relatively high power dissipation from Joule heating at the more resistive material and a relatively low power dissipation at the less resistive material. Similarly, by locating a dielectric material adjacent electrode material 270 and possibly electrode material 230 that has a thermal conductivity, κ, less than $\kappa_{SiO_2}$, the heat dissipation into dielectric material 210 and 250 may be reduced. Thus, more heat energy may be concentrated at memory material 290.

While not wishing to be bound by theory, it is believed that dissipating power in the electrical contact from Joule heating adjacent to the memory material may at least partially assist (or may even dominate) the programming of the memory material. It is also believed that dissipating power in the electrical contact remote to the memory material may actually waste power and increase the total energy needed to program the memory material. Hence, providing an electrical contact structure having a relatively high power dissipation adjacent to the memory material and a relatively low power dissipation remote to the memory material may thus decrease the total power and energy needed to program the memory device. Similarly, providing a dielectric material having a κ less than $\kappa_{SiO_2}$ decreases the total power and energy needed to program the memory device.

The discussion detailed the formation of one memory element of memory array 5. Other memory elements of memory array 5 may be fabricated in the same manner. It is to be appreciated that many, and possibly all, memory elements of memory array 5, along with other integrated circuit circuitry, may be fabricated simultaneously.

Figure 15:
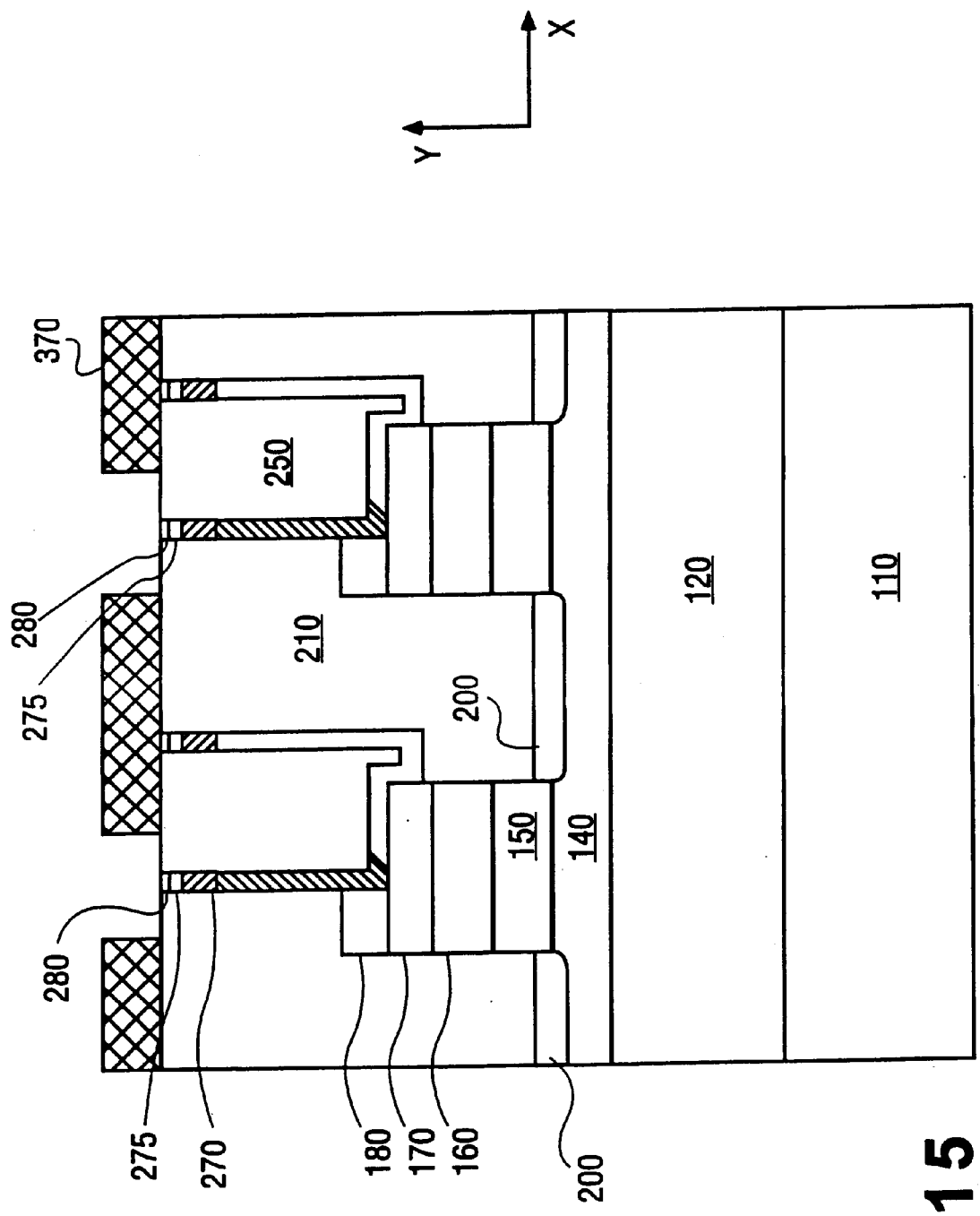
FIG. 15 shows the structure of FIG. 12, after the introduction and patterning of a masking material over a portion of the structure according to another embodiment of the invention.

In the above description, a technique and structure employing a dielectric material having a thermal conductivity, κ, less than $\kappa_{SiO_2}$, is described. An alternative embodiment to making all or a portion of one or both of dielectric materials 210 and 250 of such material is presented in FIG. 15 and FIG. 16. In this embodiment, both dielectric material 210 and dielectric material 250 are SiO$_2$ or a material having a κ similar to $\kappa_{SiO_2}$. Starting, for example, from the structure shown in FIG. 12, FIG. 15 shows the structure after the introduction of masking material 370 over the structure to define an opening over the conductive portion of an electrode material (e.g., similar in area to the area occupied over the structure by a subsequently introduced memory material 290). Suitable masking materials are known to those of skill in the art and include photoimageable materials.

Figure 16:
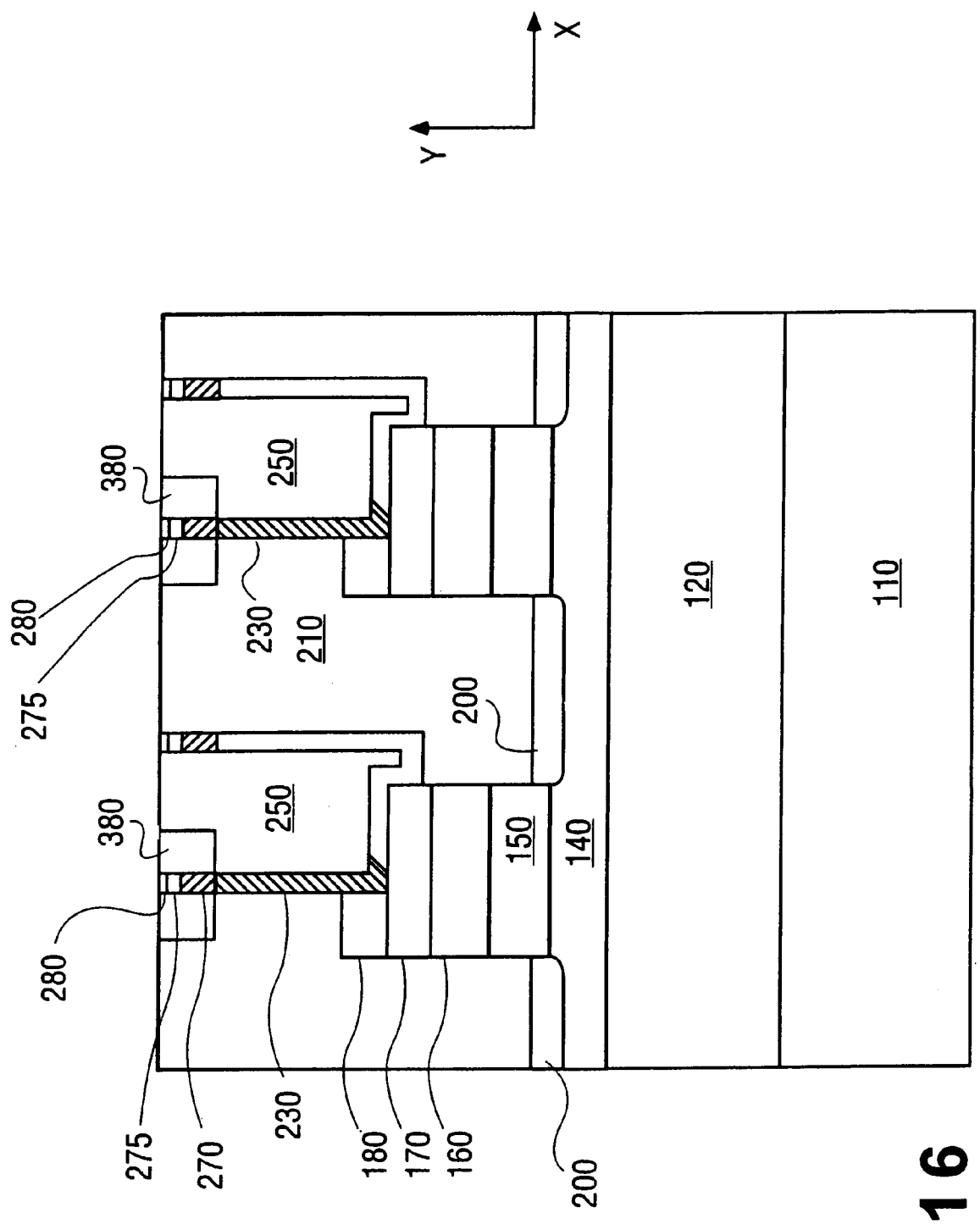
FIG. 16 shows the structure of FIG. 17 after the removal of a portion of dielectric material adjacent the electrode and the introduction of a low κ dielectric material according to another embodiment of the invention.

Following the introduction of masking material 370, dielectric material 210 and dielectric material 250 are selectively etched (at the exclusion of the electrode material) to a desired depth. A suitable etch chemistry for etching SiO$_2$ in the presence and to the exclusion of polycrystalline silicon is a gaseous hydrobromic acid and chlorine chemistry. One desired depth according to current technologies is approximately 600 Å (similar to the depth of electrode material 270). Following selective etching or removal of dielectric material 210 and dielectric material 250, masking material 370 is removed, and dielectric material 380 having a thermal conductivity, κ, less than $\kappa_{SiO_2}$, preferably three to 10 times less than $\kappa_{SiO_2}$, is introduced as shown in FIG. 16.

In the case of Xerogel, the material may be introduced by a spinning process. Following introduction, the Xerogel may be cured. A planarization may then be used, such as a CMP, to planarize the structure to a desired structure height. The process then proceeds as described above with reference to FIG. 13 and FIG. 14 and the accompanying text.

Figure 17:
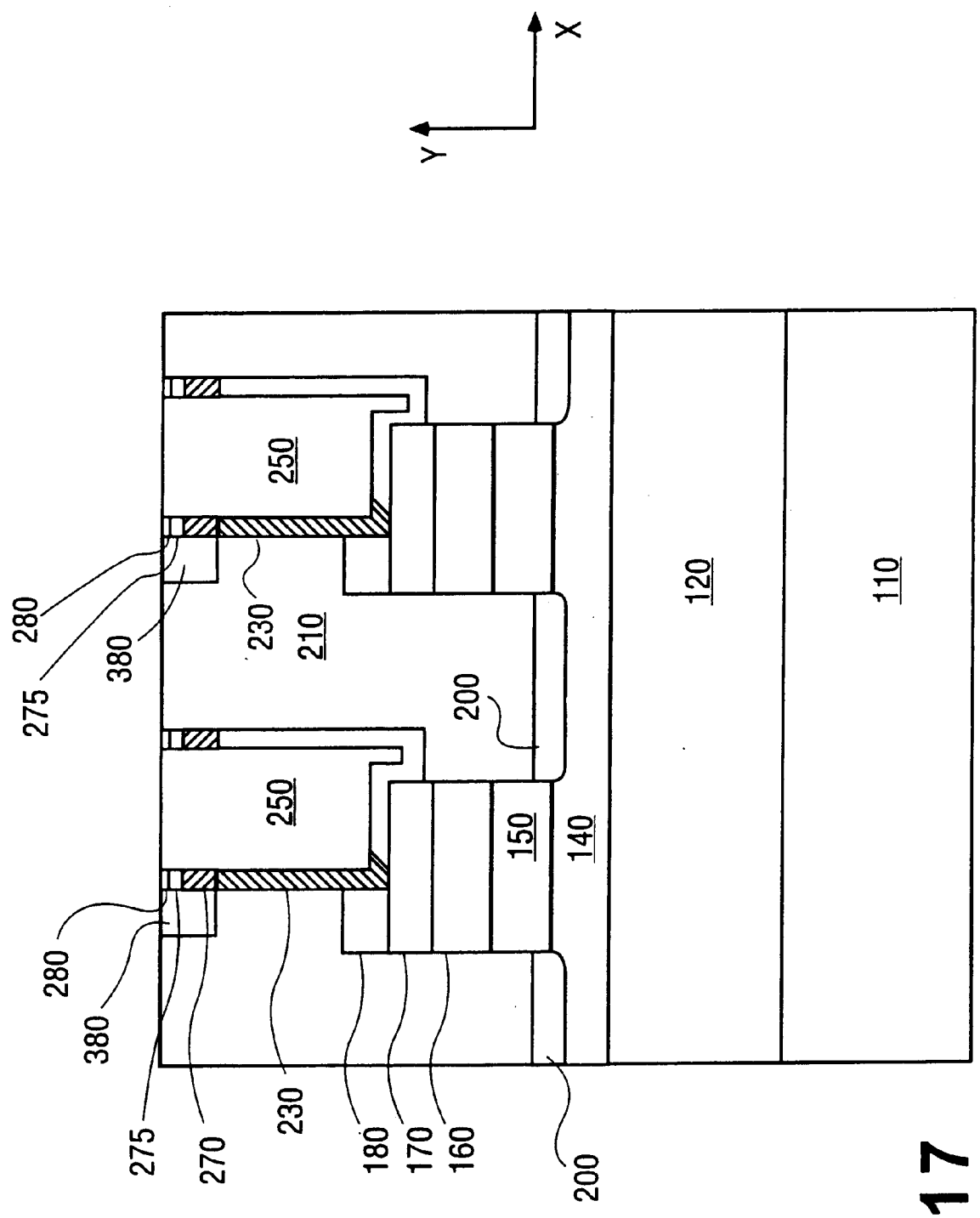
FIG. 17 shows the structure of FIG. 12 after the introduction of a low κ dielectric material adjacent the electrode according to still another embodiment of the invention.

In still another embodiment illustrated in FIG. 17, the entire portion of dielectric material 250 is a material having a κ less than $\kappa_{SiO_2}$, and a portion of dielectric material 210, adjacent electrode material 230A is a material with κ less than $\kappa_{SiO_2}$ while the remainder of dielectric material 210 is SiO$_2$ or a material having a κ similar to $\kappa_{SiO_2}$. In FIG. 17, dielectric portion 380, formed for example by selective etching similar to the technique described with reference to FIGS. 15 and 16, is a dielectric material having a κ less than $\kappa_{SiO_2}$.

It is to be appreciated that in the above embodiments (referring to, for example, FIGS. 15 through 17), there may be a right side, left side, front side, and back side to electrode material 230A, particularly to an active electrode area generally desired, as described above, to be adjacent memory material 290. The low κ dielectric material (e.g., κ less than $\kappa_{SiO_2}$) may be introduced in any or all of these locations.

Figure 18:
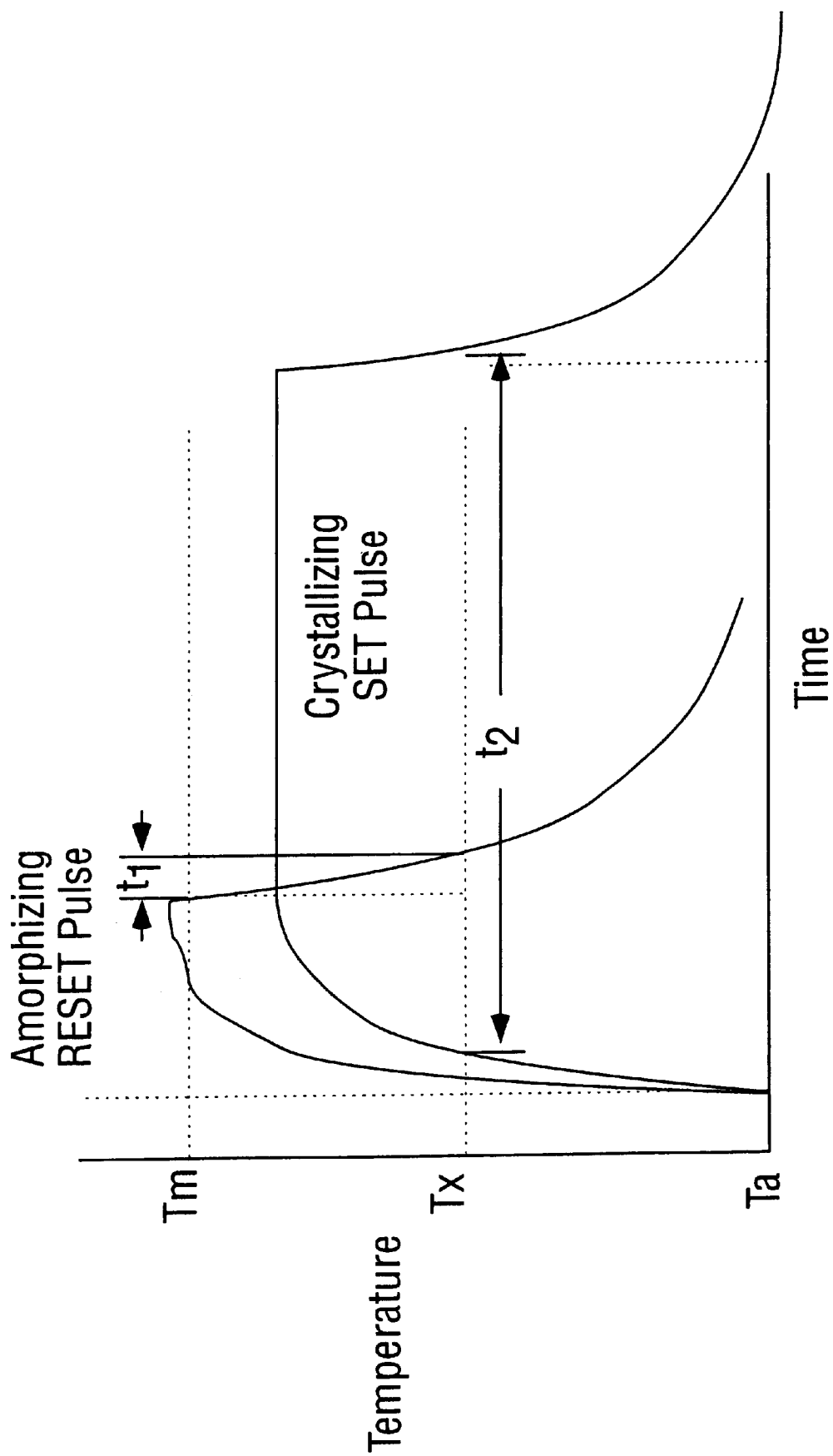
FIG. 18 shows a graphical representation of setting and resetting a volume of a phase change memory material in terms of temperature and time.

FIG. 18 presents a graphical representation of the programming (e.g., setting and resetting) of a volume of phase change memory material. Referring to FIG. 1, programming memory element 15 (addressed by column line 10a and row line 20a) involves, in one example, supplying a voltage to column line 10a to introduce a current into the volume of memory material 30. The current causes a temperature increase at the volume of memory material 30. Referring to FIG. 18, to amorphize a volume of memory material, the volume of memory material is heated to a temperature beyond the amorphizing temperature, T$_M$ (e.g., beyond the melting point of the memory material). A representative amorphizing temperature for a Te$_x$Ge$_y$Sb$_2$ material is on the order of about 600–650° C. Once a temperature beyond T$_M$ is reached, the volume of memory material is quenched or cooled rapidly (by removing the current flow). The quenching is accomplished at a rate, t$_1$, that is faster than the rate at which the volume of memory material 30 can crystallize so that the volume of memory material 30 retains its amorphous state. To crystallize a volume of memory material 30, the temperature is raised by current flow to the crystallization temperature for the material (representatively a temperature between the glass transition temperature of the material and the melting point) and retained at that temperature for a sufficient time to crystallize the material. After such time, the volume of memory material is quenched (by removing the current flow).

In each of these examples of programming (e.g., resetting and setting) a volume of memory material 30, the importance of concentrating the temperature delivery at the volume of memory material 30 is illustrated. One way this is accomplished is modifying a portion of the electrode as described above. A second alternative or additional way this is accomplished is by reducing the thermal conductivity, κ of the material adjacent electrode materials 230 and 270 and memory material 290.

In the preceding example, the volume of memory material 30 was heated to a high temperature to amorphisize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material 30 need not be partially set or reset by varying the current flow and duration through the volume of memory material.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An apparatus comprising:

a phase change element;

an electrical contact directly contacting the phase change element; and a dielectric material surrounding said contact, said dielectric material having a thermal conductivity less than the thermal conductivity of silicon dioxide, said dielectric material and said contact contact the phase change element along the same surface of said element.

2. The apparatus of claim 1 wherein said phase change element includes a chalcogenide.

3. The apparatus of claim 1 wherein said contact is cup shaped.

4. The apparatus of claim 1 wherein the dielectric material has a thermal conductivity that is at least three times less than that of silicon dioxide.

5. An apparatus comprising:

a phase change material;

a heater, arranged in electrical communication with said phase change material; and a dielectric material around said heater, said dielectric material having a thermal conductivity less than the thermal conductivity of silicon dioxide, said dielectric material and said heater contact said phase change material along a common surface.

6. The apparatus of claim 5 wherein said heater directly contacts said phase change element.

7. The apparatus of claim 5 wherein said phase change material includes chalcogenide.

8. The apparatus of claim 5 wherein said heater is cup shaped.

9. The apparatus of claim 5 wherein said dielectric material has a thermal conductivity that is at least three times less than that of silicon dioxide.

10. An apparatus comprising:

a phase change element;

an electrical heater directly contacting the phase change element and in electrical communication with said phase change element; and a dielectric material around said heater, said dielectric material having a thermal conductivity less than that of silicon dioxide, said dielectric material and said heater contact the phase change element along a common surface.

11. The apparatus of claim 10 wherein said phase change element includes a chalcogenide.

12. The apparatus of claim 10 wherein said heater is cup shaped.

13. The apparatus of claim 10 wherein said dielectric material has a thermal conductivity that is at least three times less than that of silicon dioxide.

* * * * *